United States Patent
Che et al.

(10) Patent No.: US 11,657,269 B2
(45) Date of Patent: May 23, 2023

(54) SYSTEMS AND METHODS FOR VERIFICATION OF DISCRIMINATIVE MODELS

(71) Applicant: salesforce.com, inc., San Francisco, CA (US)

(72) Inventors: Tong Che, Montreal (CA); Caiming Xiong, Menlo Park, CA (US)

(73) Assignee: salesforce.com, inc., San Francisco, CA (US)

( * ) Notice: Subject to any disclaimer, the term of this patent is extended or adjusted under 35 U.S.C. 154(b) by 838 days.

(21) Appl. No.: 16/592,474

(22) Filed: Oct. 3, 2019

(65) Prior Publication Data

US 2020/0372339 A1 Nov. 26, 2020

Related U.S. Application Data

(60) Provisional application No. 62/852,213, filed on May 23, 2019.

(51) Int. Cl.
*G06N 3/08* (2006.01)
*G06N 3/04* (2006.01)
(Continued)

(52) U.S. Cl.
CPC ............. *G06N 3/08* (2013.01); *G06F 17/18* (2013.01); *G06N 3/0454* (2013.01); *G06N 20/20* (2019.01);
(Continued)

(58) Field of Classification Search
CPC ............. H03M 7/6011; H03M 7/6005; H03M 7/3059; G06N 3/0454; G06N 20/20; G06N 3/08; G06F 17/18
See application file for complete search history.

(56) References Cited

U.S. PATENT DOCUMENTS 10,121,104 B1 * 11/2018 Hu ...................... G06N 3/0454
10,282,663 B2 * 5/2019 Socher ................. G06K 9/627
(Continued)

OTHER PUBLICATIONS

Amodei et al., "Concrete Problems in AI Safety," arXiv preprint arXiv: 1606.06565, 2016, pp. 1-29.
(Continued)

*Primary Examiner* — Mia M Thomas
(74) *Attorney, Agent, or Firm* — Haynes and Boone, LLP

(57) ABSTRACT

Verification of discriminative models includes receiving an input; receiving a prediction from a discriminative model for the input; encoding, using an encoder, a latent variable based on the input; decoding, using a decoder, a reconstructed input based on the prediction and the latent variable; and determining, using an anomaly detection module, whether the prediction is reliable based on the input, the reconstructed input, and the latent variable. The encoder and the decoder are jointly trained to maximize an evidence lower bound of the encoder and the decoder. In some embodiments, the encoder and the decoder are further trained using a disentanglement constraint between the prediction and the latent variable. In some embodiments, the encoder and the decoder are further trained without using inputs that are out of a distribution of inputs used to train the discriminative model or that are adversarial to the discriminative model.

20 Claims, 8 Drawing Sheets

(51) Int. Cl.
*G06N 20/20* (2019.01)
*G06F 17/18* (2006.01)
*H03M 7/30* (2006.01)

(52) U.S. Cl.
CPC ....... *H03M 7/3059* (2013.01); *H03M 7/6005* (2013.01); *H03M 7/6011* (2013.01)

(56) References Cited

U.S. PATENT DOCUMENTS

| | | | |
|---|---|---|---|
| 10,346,721 B2* | 7/2019 | Albright | G06T 11/60 |
| 10,503,775 B1* | 12/2019 | Ranzinger | G06V 10/464 |
| 10,814,815 B1* | 10/2020 | Rishi | B60R 21/0132 |
| 11,295,375 B1* | 4/2022 | Chitrapura | G06Q 10/06313 |
| 11,322,244 B2* | 5/2022 | Paravastu | G06N 3/0481 |
| 2007/0037124 A1* | 2/2007 | Honkura | A61C 13/235 433/189 |
| 2015/0363688 A1* | 12/2015 | Gao | G06N 3/0427 706/27 |
| 2016/0242690 A1* | 8/2016 | Principe | A61B 5/316 |
| 2016/0350653 A1 | 12/2016 | Socher et al. | |
| 2017/0024645 A1 | 1/2017 | Socher et al. | |
| 2017/0032280 A1 | 2/2017 | Socher | |
| 2017/0140240 A1 | 5/2017 | Socher et al. | |
| 2018/0082171 A1 | 3/2018 | Merity et al. | |
| 2018/0096219 A1 | 4/2018 | Socher | |
| 2018/0121787 A1 | 5/2018 | Hashimoto et al. | |
| 2018/0121788 A1 | 5/2018 | Hashimoto et al. | |
| 2018/0121799 A1 | 5/2018 | Hashimoto et al. | |
| 2018/0129931 A1 | 5/2018 | Bradbury et al. | |
| 2018/0129937 A1 | 5/2018 | Bradbury et al. | |
| 2018/0129938 A1 | 5/2018 | Xiong et al. | |
| 2018/0143966 A1 | 5/2018 | Lu et al. | |
| 2018/0144208 A1 | 5/2018 | Lu et al. | |
| 2018/0144248 A1 | 5/2018 | Lu et al. | |
| 2018/0231985 A1* | 8/2018 | Sun | G06N 7/005 |
| 2018/0268287 A1 | 9/2018 | Johansen et al. | |
| 2018/0268298 A1 | 9/2018 | Johansen et al. | |
| 2018/0300317 A1 | 10/2018 | Bradbury | |
| 2018/0300400 A1 | 10/2018 | Paulus | |
| 2018/0336198 A1 | 11/2018 | Zhong et al. | |
| 2018/0336453 A1 | 11/2018 | Merity et al. | |
| 2018/0349359 A1 | 12/2018 | Mccann et al. | |
| 2018/0373682 A1 | 12/2018 | Mccann et al. | |
| 2018/0373987 A1 | 12/2018 | Zhang et al. | |
| 2019/0130206 A1 | 5/2019 | Trott et al. | |
| 2019/0130248 A1 | 5/2019 | Zhong et al. | |
| 2019/0130249 A1 | 5/2019 | Bradbury et al. | |
| 2019/0130273 A1 | 5/2019 | Keskar et al. | |
| 2019/0130312 A1 | 5/2019 | Xiong et al. | |
| 2019/0130896 A1 | 5/2019 | Zhou et al. | |
| 2019/0130897 A1 | 5/2019 | Zhou et al. | |
| 2019/0149834 A1* | 5/2019 | Zhou | H04N 19/187 348/473 |
| 2019/0188568 A1 | 6/2019 | Keskar et al. | |
| 2019/0213482 A1 | 7/2019 | Socher et al. | |
| 2019/0251168 A1 | 8/2019 | McCann et al. | |
| 2019/0251431 A1 | 8/2019 | Keskar et al. | |
| 2019/0258714 A1 | 8/2019 | Zhong et al. | |
| 2019/0258939 A1 | 8/2019 | Min et al. | |
| 2019/0286073 A1 | 9/2019 | Asl et al. | |
| 2019/0295530 A1 | 9/2019 | Asl et al. | |
| 2020/0082916 A1* | 3/2020 | Polykovskiy | G06N 3/0472 |
| 2020/0084465 A1* | 3/2020 | Zhou | H04N 21/8126 |
| 2020/0372339 A1* | 11/2020 | Che | G06N 3/0472 |
| 2022/0147768 A1* | 5/2022 | Thermos | G06T 7/0012 |
| 2022/0156612 A1* | 5/2022 | Ren | G06N 3/0454 |

OTHER PUBLICATIONS

Bowman et al., "Generating Sentences from a Continuous Space," arXiv preprint arXiv:1511.06349, 2015, pp. 1-12.

Burda et al., "Importance Weighted Autoencoders," Under Review as a Conference Paper at ICLR 2016, arXiv preprint arXiv: 1509.00519, 2015, pp. 1-14.

Carlini et al., "Adversarial Examples are not Easily Detected: Bypassing Ten Detection Methods," In Proceedings of the 10th ACM Workshop on Artificial Intelligence and Security, ACM, 2017, pp. 1-12.

Choi et al., "WAIC, but Why? Generative Ensembles for Robust Anomaly Detection," arXiv preprint arXiv:1810.01392, 2018, pp. 1-11.

Deng et al., "Imagenet: A Large-Scale Hierarchical Image Database," In 2009 IEEE Conference on Computer Vision and Pattern Recognition, IEEE, 2009, pp. 248-255.

Devries et al., "Learning Confidence for Out-of-Distribution Detection in Neural Networks," arXiv preprint arXiv1802.04865v1, 2018, pp. 1-12.

Feinman et al., "Detecting Adversarial Samples from Artifacts," arXiv preprint arXiv:1703.00410, 2017, pp. 1-9.

Goodfellow et al., "Deep Learning," The MIT Press, Cambridge, Massachusetts, London, England, 2016, pp. 1-26.

Goodfellow et al., "Explaining and Harnessing Adversarial Examples," Published as a Conference Paper at ICLR 2015, arXiv preprint arXiv:1412.6572, 2014, pp. 1-11.

Guo et al., "On Calibration of Modern Neural Networks," In Proceedings of the 34th International Conference on Machine Learning, Sydney, Australia, PMLR 70, JMLR, org, 2017, pp. 1-14.

He et al., "Deep Residual Learning for Image Recognition," In Proceedings of the IEEE Conference on Computer Vision and Pattern Recognition, pp. 770-778, 2016.

Hendrycks et al., "A Baseline for Detecting Misclassified and Out-of-Distribution Examples in Neural Networks," Published as a Conference Paper at ICLR 2017, arXiv preprint arXiv: 1610.02136v3, pp. 1-12.

Hendrycks et al., "Deep Anomaly Detection with Outlier Exposure," Published as a Conference Paper at ICLR 2019, arXiv preprint arXiv:1812.04606v3, pp. 1-18.

Hjelm et al., "Learning Deep Representations by Mutual Information Estimation and Maximization," arXiv preprint arXiv:1808.06670, 2018, pp. 1-17.

Huang et al., "Densely Connected Convolutional Networks," In Proceedings of the IEEE Conference on Computer Vision and Pattern Recognition, pp. 4700-4708, 2017.

Krizhevsky et al., "Learning Multiple Layers of Features from Tiny Images," Technical Report, Citeseer, 2009, pp. 1-60.

Kurakin et al., "Adversarial Examples in the Physical World," arXiv preprint arXiv:1607.02533, 2016, pp. 1-15.

Lee et al., "Training Confidence-Calibrated Classifiers for Detecting Out-of-Distribution Samples," Published as a Conference Paper at ICLR 2018a, arXiv preprint arXiv:1711.09325v3, pp. 1-16.

Lee et al., "A Simple Unified Framework for Detecting Out-of-Distribution Samples and Adversarial Attacks," 32nd Conference on Neural Information Processing Systems (NeurIPS 2018), Montreal, Canada, pp. 1-11.

Liang et al., "Enhancing the Reliability of Out-of-Distribution Image Detection in Neural Networks," Published in a Conference Paper at ICLR 2018, arXiv preprint arXiv:1706.02690v4, pp. 1-27.

Ma et al., "Characterizing Adversarial Subspaces Using Local Intrinsic Dimensionality," arXiv preprint arXiv:1801.02613, 2018, pp. 1-15.

Moosavi-Dezfooli et al., "Deepfool: a Simple and Accurate Method to Fool Deep Neural Networks," In Proceedings of the IEEE Conference on Computer Vision and Pattern Recognition, 2016, pp. 2574-2582.

Nalisnick et al., "Do Deep Generative Models Know What They Don't Know?," arXiv preprint arXiv:1810.09136, 2018, pp. 1-19.

Netzer et al., "Reading Digits in Natural Images with Unsupervised Feature Learning," arXiv preprint arXiv:1810.09136v1, 2011, pp. 1-19.

Pimentel et al., "A Review of Novelty Detection," Signal Processing, 99(6), 2014 pp. 215-249.

Quintanilha et al., "Detecting Out-of-Distribution Samples using Low-Order Deep Features Statistics," Under Review as a Conference Paper at ICLR 2019, Openreview, 2018, pp. 1-17.

(56) References Cited

OTHER PUBLICATIONS

Reed et al., Learning Deep Representations of Fne-Grained Visual Descriptions. In Proceedings of the IEEE Conference on Computer Vision and Pattern Recognition, 2016a, pp. 49-58.

Reed et al., "Generative Adversarial Text to Image Synthesis," Proceedings of the 33rd International Conference on Machine Learning, New York, NY, USA, arXiv preprint arXiv:1605.05396, 2016b, pp. 1-10.

Jammalamadaka et al., "Out-of-Distribution Detection using an Ensemble of Self Supervised Leave-Out Classifiers," ECCV, 2018, pp. 1-15.

Xu et al., "Show, Attend and Tell: Neural Image Caption Generation with Visual Attention," Proceedings of the 32nd International Conference Machine Learning, Lille, France, 2015, JMLR: W&CP vol. 37, pps.

Yu et al., "LSUN: Construction of a Large-Scale Image Dataset using Deep Learning with Humans in the Loop," arXiv preprint arXiv:1506.03365, 2015, pp. 1-9.

Zagoruyko et al., "Wide Residual Networks," arXiv preprint arXiv:1605.07146, 2016, pp. 1-13.

\* cited by examiner

| In-Dist | OOD | Validation on OOD samples | | | Validation on adversarial samples | | |
|---|---|---|---|---|---|---|---|
| | | TNR@TPR 95% | AUROC ODIN/SUF/Our | Verification acc. | TNR@TPR 95% | AUROC ODIN/SUF/Our | Verification acc. |
| CIFAR-10 DenseNet | SVHN | 86.2/90.8/92.4 | 95.5/98.1/99.0 | 91.4/93.0/95.1 | 70.5/89.6/91.2 | 92.8/97.6/98.1 | 86.5/92.6/94.2 |
| | T-ImageN | 92.4/95.0/96.2 | 98.5/98.8/99.0 | 93.9/95.0/97.3 | 87.1/94.9/95.6 | 97.2/98.8/99.1 | 92.1/95.0/97.4 |
| | LSUN | 96.2/97.2/98.6 | 99.2/99.3/99.3 | 95.7/96.3/96.8 | 92.9/97.2/97.9 | 98.5/99.2/99.3 | 94.3/96.2/97.5 |
| CIFAR-100 DenseNet | SVHN | 70.6/86.5/85.2 | 93.8/97.2/97.3 | 86.6/91.5/93.4 | 39.8/63.2/70.5 | 88.2/91.8/92.2 | 80.7/84.6/86.3 |
| | T-ImageN | 42.6/86.6/89.0 | 85.2/97.4/97.4 | 77.0/92.2/93.8 | 43.2/87.2/89.1 | 85.3/97.0/97.8 | 72.2/91.8/93.0 |
| | LSUN | 41.2/91.4/93.7 | 85.5/98.0/98.2 | 77.1/93.9/94.0 | 42.1/91.4/93.6 | 85.7/97.9/98.3 | 77.3/93.8/95.4 |
| SVHN DenseNet | CIFAR-10 | 71.7/96.8/97.4 | 91.4/98.9/99.2 | 85.8/95.9/96.5 | 69.3/97.5/97.8 | 91.9/98.8/99.1 | 86.6/96.3/97.4 |
| | T-ImageN | 84.1/99.9/100 | 95.1/99.9/99.9 | 90.4/98.9/99.2 | 79.8/99.9/99.9 | 94.8/99.8/99.9 | 90.2/98.9/99.4 |
| | LSUN | 81.1/100/100 | 94.5/99.9/99.9 | 89.2/99.3/99.6 | 77.1/100/100 | 94.1/99.9/100 | 89.1/99.2/99.5 |
| CIFAR-10 ResNet | SVHN | 86.6/96.4/98.3 | 96.7/99.1/99.2 | 91.1/95.8/97.3 | 40.3/75.8/78.1 | 86.5/95.5/98.1 | 77.8/89.1/92.2 |
| | T-ImageN | 72.5/97.1/98.0 | 94.0/99.5/99.6 | 86.5/96.3/96.9 | 96.6/95.5/97.1 | 93.9/99.0/99.2 | 86.0/95.4/96.3 |
| | LSUN | 73.8/98.9/99.0 | 94.1/99.7/99.7 | 86.7/97.7/97.9 | 70.0/98.1/98.9 | 93.7/99.5/99.5 | 85.8/97.2/98.0 |
| CIFAR-100 ResNet | SVHN | 62.7/91.9/93.5 | 93.9/98.4/98.8 | 88.0/93.7/94.8 | 12.2/41.9/46.2 | 72.0/84.4/86.3 | 67.7/76.5/79.4 |
| | T-ImageN | 49.2/90.9/91.2 | 87.6/98.2/98.5 | 80.1/93.3/94.3 | 33.5/70.3/74.6 | 83.6/87.9/90.3 | 75.9/84.6/89.8 |
| | LSUN | 45.6/90.9/92.3 | 85.6/98.2/98.6 | 78.3/93.5/93.7 | 31.6/56.6/63.5 | 81.9/82.3/85.2 | 74.6/79.7/81.9 |
| SVHN ResNet | CIFAR-10 | 79.8/98.4/99.4 | 92.1/99.3/99.9 | 89.4/96.9/97.5 | 79.8/94.1/94.5 | 92.1/97.6/98.7 | 89.4/94.6/94.8 |
| | T-ImageN | 82.1/99.9/100 | 92.0/99.9/99.9 | 89.4/99.1/99.9 | 80.5/99.2/99.7 | 92.9/99.3/99.5 | 90.1/98.8/99.3 |
| | LSUN | 77.3/99.9/99.9 | 89.4/99.0/99.9 | 87.2/99.5/100 | 76.3/99.9/99.9 | 90.7/99.9/99.8 | 88.2/99.5/99.8 |

*FIG. 7*

|  | CIFAR-10 | CIFAR-100 |
|---|---|---|
| ODIN/SUF | 4.81 | 22.37 |
| DenseNet/DVN | 4.51 | 22.27 |

FIG. 8

| Disentangle | TNR@TPR95% | AUROC |
|---|---|---|
| ✓ | 98.4 | 99.2 |
| - | 62.6 | 84.7 |

FIG. 10

| Backbone | Dataset | Method | Negative samples for training | Input Pre-processing | DeepFool | CW | BIM |
|---|---|---|---|---|---|---|---|
| DenseNet | CIFAR-10 | KD+PU | FGSM | - | 68.34 | 53.21 | 3.10 |
|  |  | LID | FGSM | - | 70.86 | 71.50 | 94.55 |
|  |  | SUF | FGSM | Yes | 87.95 | 83.42 | 98.51 |
|  |  | Our | - | - | 90.14 | 86.38 | 99.42 |
|  | CIFAR-100 | KD+PU | FGSM | - | 65.30 | 58.08 | 86.86 |
|  |  | LID | FGSM | - | 69.68 | 72.36 | 68.62 |
|  |  | SUF | FGSM | Yes | 75.63 | 86.20 | 98.27 |
|  |  | Our | - | - | 80.01 | 88.55 | 99.04 |
|  | SVHN | KD+PU | FGSM | - | 84.38 | 82.94 | 83.28 |
|  |  | LID | FGSM | - | 80.14 | 85.09 | 92.21 |
|  |  | SUF | FGSM | Yes | 93.47 | 96.95 | 99.12 |
|  |  | Our | - | - | 94.14 | 97.35 | 99.12 |
| ResNet | CIFAR-10 | KD+PU | FGSM | - | 76.80 | 56.30 | 16.16 |
|  |  | LID | FGSM | - | 71.86 | 77.53 | 95.38 |
|  |  | SUF | FGSM | Yes | 78.06 | 93.90 | 98.91 |
|  |  | Our | - | - | 82.45 | 95.51 | 99.07 |
|  | CIFAR-100 | KD+PU | FGSM | - | 57.78 | 73.72 | 68.85 |
|  |  | LID | FGSM | - | 63.15 | 75.03 | 55.82 |
|  |  | SUF | FGSM | Yes | 81.95 | 80.96 | 96.38 |
|  |  | Our | - | - | 85.22 | 93.38 | 97.72 |
|  | SVHN | KD+PU | FGSM | - | 84.30 | 67.85 | 43.21 |
|  |  | LID | FGSM | - | 67.28 | 76.58 | 84.88 |
|  |  | SUF | FGSM | Yes | 72.20 | 86.73 | 95.39 |
|  |  | Our | - | - | 86.13 | 89.38 | 96.10 |

FIG. 11

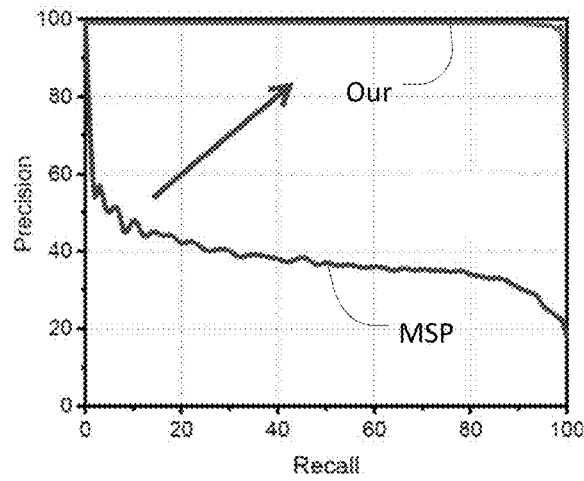
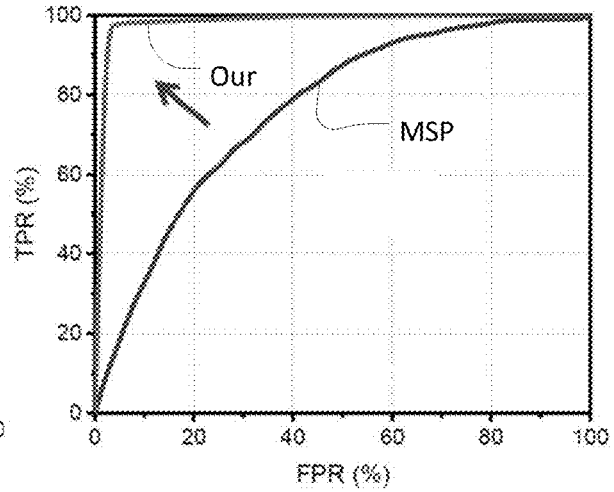
FIG. 9A                    FIG. 9B
| In-Dist | OOD | Validation on OOD samples | | |
|---|---|---|---|---|
| | | TNR@TPR 95% | AUROC | Verification acc. |
| Oxford-102 | CUB-200 | 55.6 | 72.3 | 79.5 |
| | LSUN | 50.5 | 71.8 | 76.2 |
| | COCO | 40.3 | 74.4 | 73.3 |
| CUB-200 | Oxford-102 | 39.8 | 68.4 | 72.5 |
| | LSUN | 36.3 | 65.4 | 69.5 |
| | COCO | 35.4 | 60.7 | 71.0 |
FIG. 12

SYSTEMS AND METHODS FOR VERIFICATION OF DISCRIMINATIVE MODELS

RELATED APPLICATIONS

The present disclosure claims priority under 35 U.S.C. 119 to U.S. Provisional Application No. 62/852,213, filed on May 23, 2019, which is hereby expressly incorporated by reference herein in its entirety.

TECHNICAL FIELD

The present disclosure relates generally to training and use of machine learning systems and more specifically to verification of discriminative models with generative models.

BACKGROUND

Artificial intelligence (AI) has been widely used in many deep learning applications such as image classification, caption generation, sequence modeling, machine translation, autonomous driving, and/or the like. In existing AI systems, the performance of AI models, e.g., the accuracy of predictions generated by the AI model, is generally evaluated based on the assumption that the training and testing data for the AI model is sampled from similar distributions of data. In some embodiments, these AI systems rely on one or more discriminative models. These models receive an input and provide a predictive output regarding the input. For example, a discriminative model may provide a conclusion about the input, such as a recognition of an object for a visual discriminator, recognition of a concept for a textual discriminator, generation of a classification for the input, and/or the like. In practice, however, it is difficult to verify the prediction of the discriminative model when it is presented with inputs that are not in the training data used to train the discriminative model. For example, it is difficult to verify whether the discriminative prediction for an input that is out of the distribution of the inputs used during training is correct. This is also true for an input that is adversarial to the discriminative model such that even though the input is within the distribution of the inputs used during training, the output of the discriminative model is incorrect for that adversarial input. Thus, in real-world deployments, when test data distributions can be highly uneven due to dynamically changing environments and/or malicious attacks, existing AI systems may generate misleading results, which may pose safety issues for many applications such as security authentication, medical diagnosis, autonomous driving, and/or the like.

Accordingly, it would advantageous to have systems and methods for verification of discriminative models.

BRIEF DESCRIPTION OF THE DRAWINGS

FIG. 7 is a simplified diagram of image classification results according to some embodiments.

FIG. 8 is a simplified diagram of test error rate according to some embodiments.

FIGS. 9A and 9B are simplified diagrams of comparative recall and false positive rates according to some embodiments.

FIG. 10 is a simplified diagram of the impact of disentanglement according to some embodiments.

FIG. 11 is a simplified diagram of an area under the receiver operating characteristic curve (AUROC) according to some embodiments.

FIG. 12 is a simplified diagram of image captioning results according to some embodiments.

In the figures, elements having the same designations have the same or similar functions.

DETAILED DESCRIPTION

In view of the need for calibrating predictive uncertainty in AI models, a verifier module is provided to verify the predictions of discriminative models by using generative models that reversely generate an input given the prediction from the discriminative model. Specifically, given an input x provided to a discriminative model and a prediction y' by the discriminative model, where the predictive model is characterized by the probability $p(y|x)$, the verification model generates a reconstructed input x', where the verification model is trained to produce an output probability $p(x|y)$. The output probability $p(x|y)$ from the verification model estimates the density of x given the prediction y. In order to estimate this likelihood $p(x|y)$, the verification model uses a conditional variational autoencoder optionally imposed with disentanglement constraints to obtain the x density, and thus compare the reconstructed input x' with the actual input x to evaluate the reliability of the prediction y' provided by the discriminative model. In this way, the verifier module may be implemented to evaluate the performance of the discriminative model without reprocessing of the input samples, or any change to the model architecture, or re-training with an additional loss function used for the training discriminative model.

As used herein, the term "network" may comprise any hardware or software-based framework that includes any artificial intelligence network or system, neural network or system and/or any training or learning models implemented thereon or therewith.

As used herein, the term "module" or "model" may comprise hardware or software-based framework that performs one or more functions. In some embodiments, the module or model may be implemented on one or more neural networks.

Figure 1:
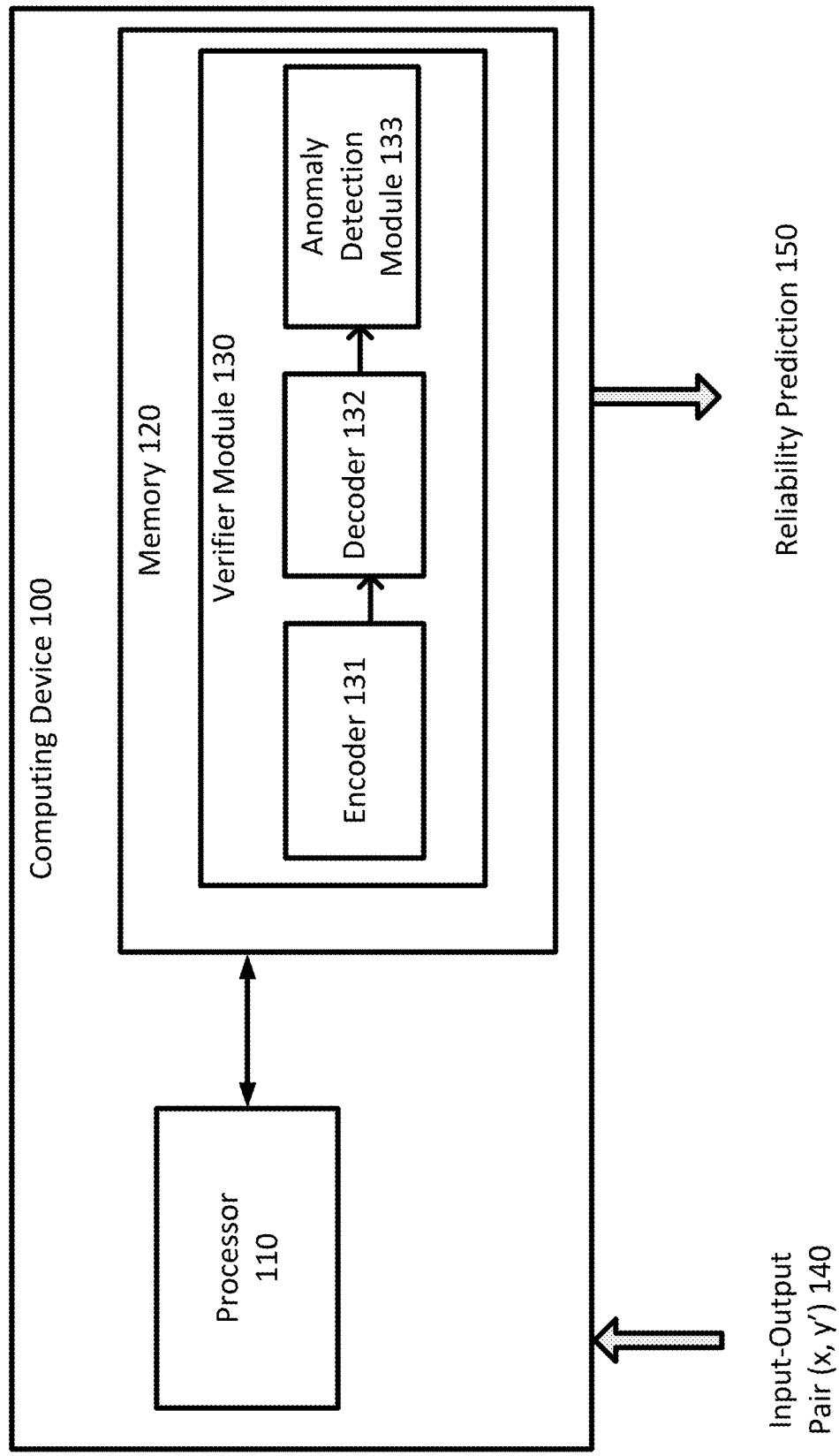
FIG. 1 is a simplified diagram of a computing device implementing a verifier system, according to some embodiments.

FIG. 1 is a simplified diagram of a computing device 100 for implementing a verifier module 130 according to some embodiments. As shown in FIG. 1, computing device 100 includes a processor 110 coupled to memory 120. Operation of computing device 100 is controlled by processor 110. And although computing device 100 is shown with only one processor 110, it is understood that processor 110 may be representative of one or more central processing units, multi-core processors, microprocessors, microcontrollers, digital signal processors, field programmable gate arrays (FPGAs), application specific integrated circuits (ASICs), graphics processing units (GPUs), tensor processing units (TPUs), and/or the like in computing device 100. Computing device 100 may be implemented as a stand-alone subsystem, as a board added to a computing device, and/or as a virtual machine.

Memory 120 may be used to store software executed by computing device 100 and/or one or more data structures used during operation of computing device 100. Memory 120 may include one or more types of machine readable media. Some common forms of machine readable media may include floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which a processor or computer is adapted to read.

Processor 110 and/or memory 120 may be arranged in any suitable physical arrangement. In some embodiments, processor 110 and/or memory 120 may be implemented on a same board, in a same package (e.g., system-in-package), on a same chip (e.g., system-on-chip), and/or the like. In some embodiments, processor 110 and/or memory 120 may include distributed, virtualized, and/or containerized computing resources. Consistent with such embodiments, processor 110 and/or memory 120 may be located in one or more data centers and/or cloud computing facilities.

In some examples, memory 120 may include non-transitory, tangible, machine readable media that includes executable code that when run by one or more processors (e.g., processor 110) may cause the one or more processors to perform the methods described in further detail herein. For example, as shown, memory 120 includes instructions for a verifier module 130 that may be used to implement and/or emulate the systems and models, and/or to implement any of the methods described further herein. In some examples, the verifier module 130 may be used to perform performance evaluation on an input-output pair (x, y') 140 corresponding to an input x provided to a discriminative model (not shown) and an output prediction y' provided by the discriminative model. In some examples, verifier module 130 may also handle the iterative training and/or evaluation of a system or model used for verification tasks as is described in further detail below.

In some embodiments, verifier module 130 is arranged as a variational autoencoder. As shown, verifier module 130 includes an encoder 131, a decoder 132, and an anomaly detection module 133, which may be serially connected or connected in other manners as is described in further detail below. In some examples, verifier module 130 and the sub-modules 131-133 may be implemented using hardware, software, and/or a combination of hardware and software.

As shown, computing device 100 receives input such as an input-output pair (x, y') 140 (e.g., given by the discriminative model) which is provided to verifier module 130 to evaluate the reliability of the discriminative model. In some examples, the input-output pair (x, y') 140 may include an input image x and an output of an image caption y' for the input image. In some examples, the input-output pair (x, y') 140 may include an input (e.g., an image and/or natural language text) and an output classification y' for input x. In some examples, the discriminative model may include any type of predictive model that receives an input x and generates a prediction y'. Verifier module 130 operates on the input-output pair (x, y') 140 via encoder 131, decoder 132, and anomaly detection module 133 to generate an output of a reliability prediction 150 corresponding to the input-output pair (x, y') 140, representing whether the prediction y' is reliable. For example, the prediction y' may not be reliable if input x is out-of-distribution, input x is adversarial, and/or the prediction y' based on input x made by the discriminative model is incorrect.

According to some embodiments, verifier module 130 is configured to verify the prediction y' provided by the predictive model given input x and prediction y'. Verifier module 130 is trained as a verifier network $q_\varphi(x|y)$ as an approximation to the inverse posterior distribution $p(x|y)$. Modelling $p(x|y)$ provides a unified framework for verifying out-of-distribution x, adversarial examples, and/or mispredictions of the discriminative model.

Figure 2:
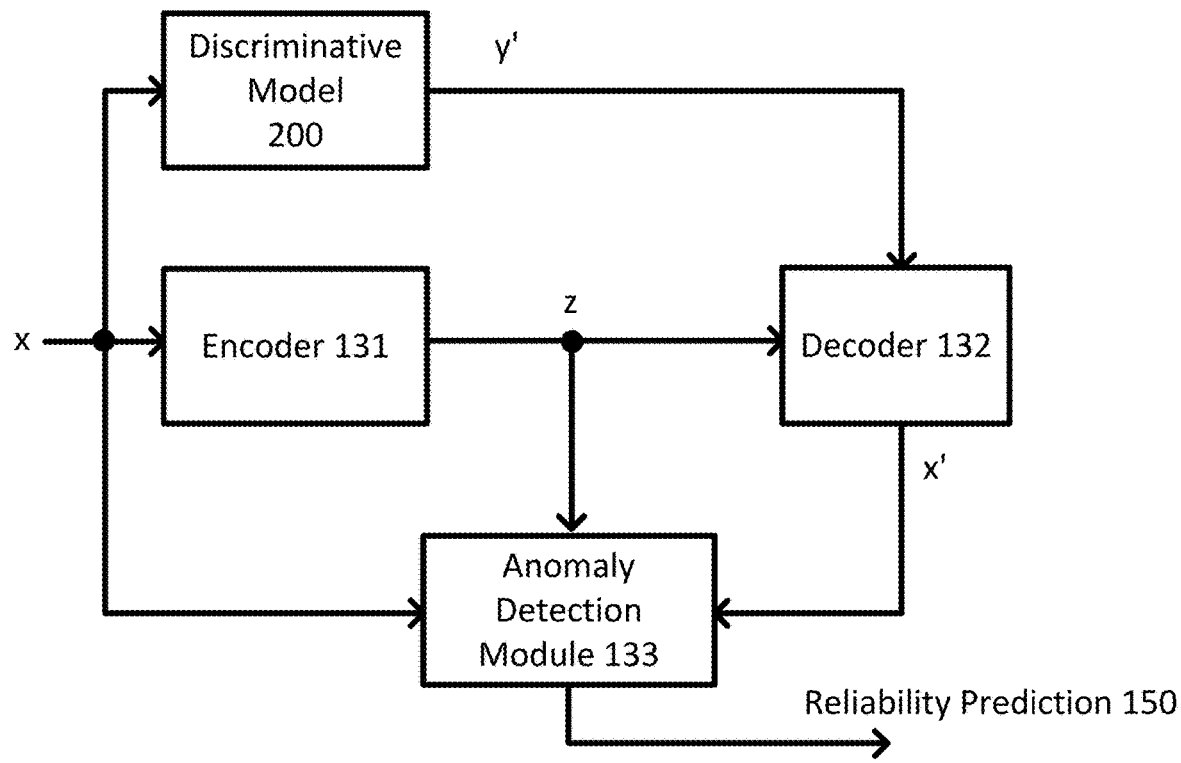
FIG. 2 is a simplified diagram of a verifier module being used to verify a discriminative model according to some embodiments.

FIG. 2 is a simplified diagram of a verifier module being used to verify a discriminative model according to some embodiments described herein. As shown in FIG. 2, an input x is provided to a discriminative model 200, which produces, as an output, a prediction y'. The input x is also provided to encoder 131, which generates a latent variable z. In some examples, encoder 131 is a stochastic encoder. In some examples, encoder 131 is a convolutional neural network. In some examples, encoder 131 includes two, three, four, or more convolutional layers. In some examples, latent variable z is an encoded vector. In some examples, latent variable z is a 128-dimensional vector.

The latent variable z and prediction y' from discriminative model 200 are then provided to decoder 132, which generates a reconstructed input x' based on the distribution $p(x|z,y)$ learned by decoder 132 during training as is described in further detail below. In some examples, decoder 132 is a stochastic decoder. In some examples, decoder 132 is a convolutional neural network. In some examples, decoder 132 includes two, three, four, or more deconvolutional layers.

Input x, latent variable z, and reconstructed input x' are then passed to anomaly detection module 133 to generate reliability prediction 150. In some examples, anomaly detection module 133 evaluates the loss in the generation of latent variable z and reconstructed input x'. In some examples, the loss is a log-likelihood loss. In some examples, the loss corresponds to the evidence lower bound for encoder 131 and decoder 132. In some examples, the loss includes a reconstruction loss, such as an $L^2$ loss between input x and reconstructed input x'. In some examples, the loss includes an estimate of the Kullback-Leibler (KL) variational autoencoder (VAE) loss) for encoder 131 and latent variable z. The KL VAE loss is described in further detail in Doersch, "Tutorial on Variational Autoencoders," 2016, available at https://arxiv.org/abs/1606.05908, which is incorporated by reference. Anomaly detection module 133 then compares the loss and/or the log of the loss to a threshold δ. When the loss and/or the log of the loss is greater than or equal to threshold δ, prediction y' is considered reliable. When the loss and/or the log of the loss is less than threshold δ, prediction y' is considered unreliable. In some examples, prediction y' may be considered unreliable when input x is out-of-distribution, input x is adversarial, and/or prediction y' is likely to be incorrect.

Figure 3:
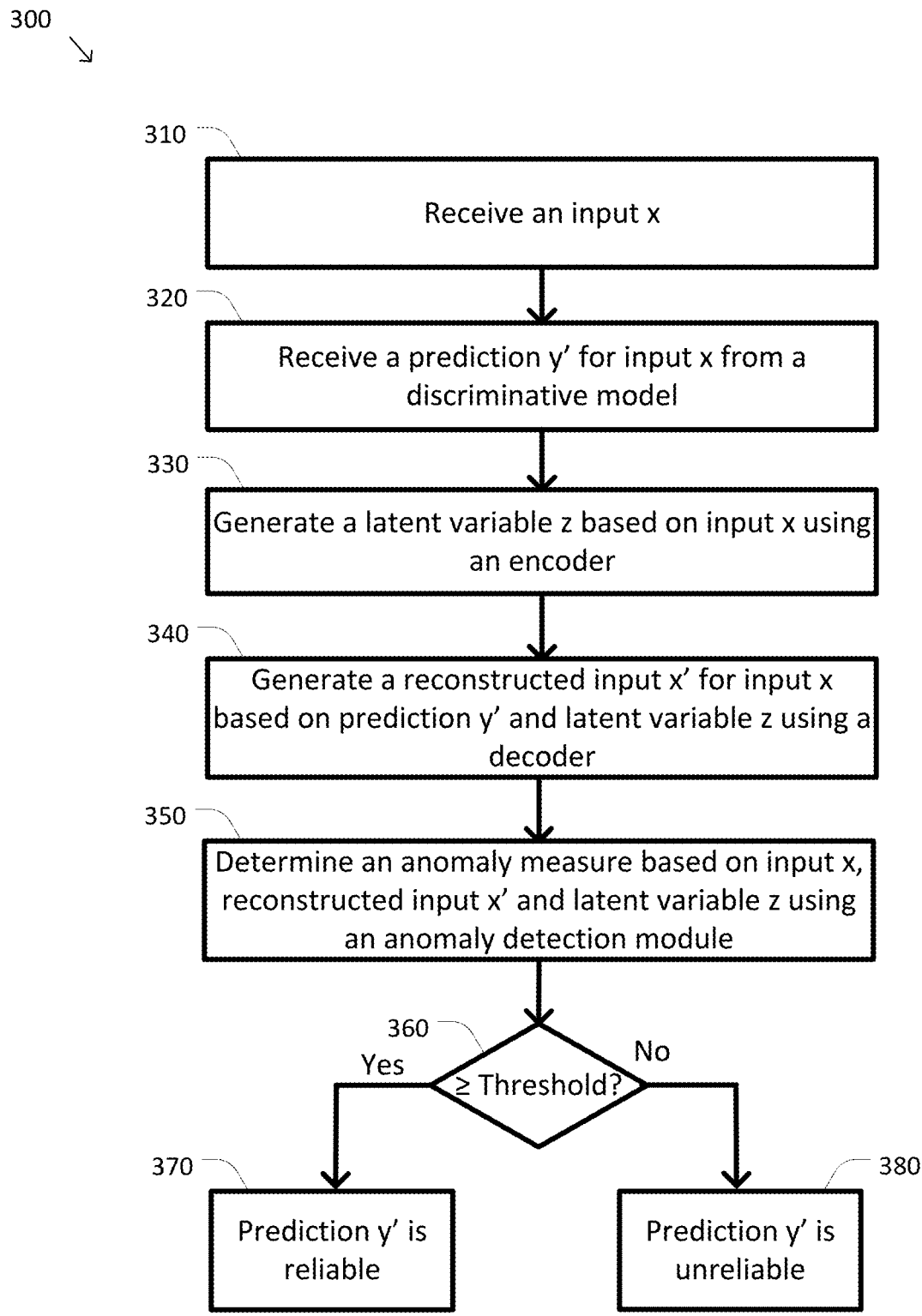
FIG. 3 is a simplified diagram of a method of verifying a prediction of a discriminative model according to some embodiments.

FIG. 3 is a simplified diagram of a method 300 of verifying a prediction of a discriminative model according to some embodiments. One or more of the processes 310-380 of method 300 may be implemented, at least in part, in the form of executable code stored on non-transitory, tangible, machine-readable media that when run by one or more processors may cause the one or more processors to perform one or more of the processes 310-380. In some embodiments, method 300 may correspond to the method used by verifier module 130 and/or the structures of FIG. 2 to verify whether a prediction made by a discriminative model, such as discriminative model 200, may be relied upon.

At a process 310, an input x is received. Input x corresponds to an input x to be presented to a discriminative model, such as discriminative model 200. Depending upon the purpose of the discriminative model, input x may be an image, natural language text, and/or the like.

At a process 320, a prediction y' is received from the discriminative model. Prediction y' is the output of the discriminative model based on the input x. Prediction y' corresponds to the prediction of the discriminative model to be evaluated by method 300 to determine whether it is reliable.

At a process 330, a latent variable z is generated by an encoder based on input x. In some examples, the encoder corresponds to encoder 131.

At a process 340, a reconstructed input x' for input x is generated by an encoder based on prediction y' and latent variable z. In some examples, the decoder corresponds to decoder 132.

At a process 350, an anomaly measure is determined by an anomaly detection module based on input x, reconstructed input x', and latent variable z. In some examples, the anomaly detection module corresponds to anomaly detection module 133. In some examples, the anomaly measure is the evidence lower bound loss for encoder 131 and decoder 132 for input x. In some examples, the anomaly measure is a log of the loss. In some examples, the anomaly measure includes a reconstruction loss, such as the $L^2$ loss between input x and reconstructed input x'. In some examples, the anomaly measure includes the VAE loss for the encoder and latent variable z.

At a process 360, it is determined, by the anomaly detection module, whether the anomaly measure is greater than or equal to a threshold δ. In some examples, threshold δ is selected to obtain a desired true positive rate (e.g., 95 percent). In some examples, the threshold δ is determined via search during training so that the probability that an input x is correctly verified as within the input training distribution when the input x is within the input training distribution is at or above the desired true positive rate. When the anomaly measure is greater than or equal to threshold δ, prediction y' is considered reliable by a process 370 and may be used for further processing. When the anomaly measure is less than threshold δ, prediction y' is considered unreliable by a process 380, which may generate an error, an alert, and/or the like. In some examples, process 380 may recommend a remedial action, such as discarding and/or ignoring prediction y' generated by the discriminative model.

Method 300 may then be repeated for additional inputs x and predictions y'.

Figure 4:
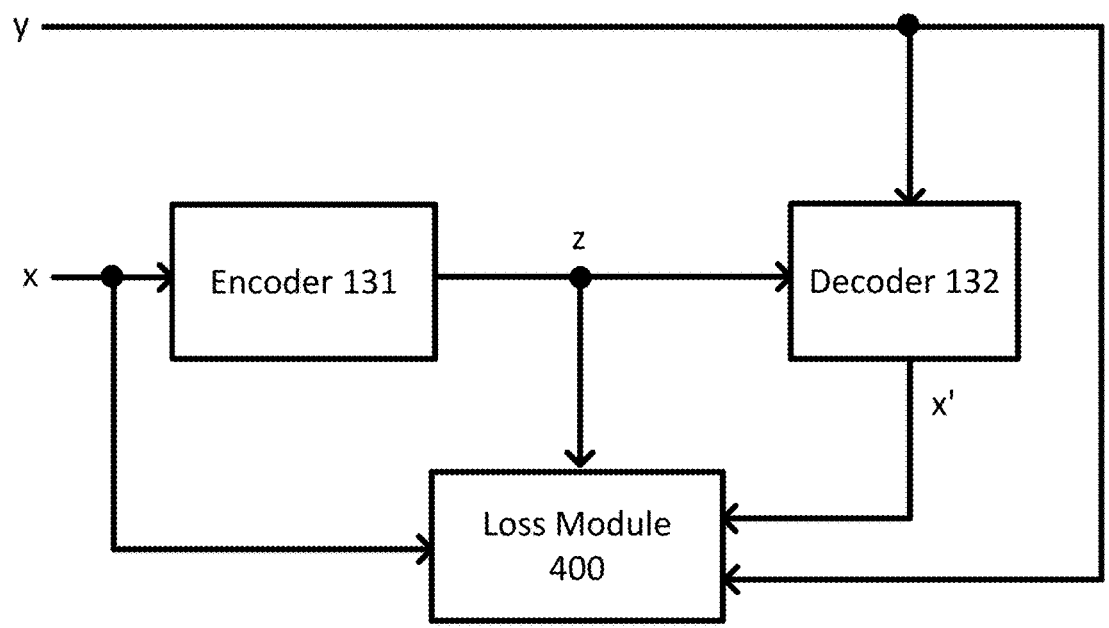
FIG. 4 is a simplified diagram of a verifier module during training according to some embodiments.

FIG. 4 is a simplified diagram of a verifier module during training according to some embodiments. As shown in FIG. 4, the verifier module is being trained using the same training data that may be used to train a corresponding discriminative model, such as discriminative model 200. More specifically, the verifier module of FIG. 4 receives a training pair (x, y) corresponding to an input x and a ground truth prediction y for the discriminative model. Similar to the arrangement of the verifier module as shown in FIG. 2, input x is passed to encoder 131, which generates latent variable z corresponding to input x. Latent variable z and ground truth prediction y are then passed to decoder 132, which generates reconstructed input x'. Input x, ground truth prediction y, latent variable z, and reconstructed input x' are then passed to a loss module 400.

Loss module 400 then determines a loss for the training pair (x, y), which is used to update the parameters of encoder 131 and decoder 132. In some examples, the loss may be backpropagated to update the parameters of encoder 131 and/or decoder 132. In some examples, the backpropagation may be performed using any suitable training algorithm, such as stochastic gradient descent, adaptive moment estimation (ADAM), and/or the like.

According to some embodiments, loss module 400 jointly trains encoder 131 and decoder 132 to maximize the evidence lower bound error for encoder 131 and decoder 132. In some examples, the evidence lower bound loss includes a reconstruction loss, such as an $L^2$ loss between input x and reconstructed input x'. In some examples, the reconstruction loss is helpful in detecting when an input x is out-of-distribution. In some examples, the evidence lower bound loss includes an estimate of the KL VAE loss for encoder 131 and latent variable z as shown in Equation 1 and as further described earlier with respect to FIG. 2. In some examples, the KL VAE loss helps detect when an input x is mapped to a latent variable z value within a low density region of encoder 131.

$$L = -\mathbb{E}_{q(z|x)}[\log p(x|z,y)] + KL(q(z|x)\|p(z)) \quad \text{Equation 1}$$

According to some embodiments, loss module 400 may further implement a disentanglement constraint. In some examples, one problem of training encoder 131 is that, if care is not taken, decoder 132 may be trained to ignore the effect of ground truth prediction y and, instead, pass only information through from latent variable z. In general, this is not desirable as one goal of decoder 132 is to model the conditional likelihood p(x|y) and not simply p(x). In some examples, one solution to this problem is to add a disentanglement constraint when training encoder 131 and decoder 132, so that latent variable z and ground truth prediction y are independent features. In some examples, this may be accomplished by including a loss term that minimizes the mutual information between latent variable z and ground truth prediction y as shown in Equation 2, where Î(y, z) is the mutual information loss term and λ is a weighting coefficient.

$$L = -\mathbb{E}_{q(z|x)}[\log p(x|z,y) + \lambda \hat{I}(y,z)] + KL(q(z|x)\|p(z)) \quad \text{Equation 2}$$

In some embodiments, Î(y, z) may be modeled as a deep Infomax according to Equation 3, where $s_+$ is the softplus function and T(y, z)=T(z, y) is determined using a trained discriminator network. Deep Infomax are described in further detail in Hjelm, et al., "Learning Deep Representations by Mutual Information Estimation and Maximization," 2019 International Conference for Learning Representations, which is incorporated by reference. In some embodiments, the discriminator network for T(y, z) may be trained to maximize Î(y, z) in order to get a better estimate for the mutual information between latent variable z and ground truth prediction y, while encoder 131 and decoder 132 are trained to minimize the loss L. In some examples, the discriminator network used to generate T(y, z) may be trained similar to the approach used when determining a generative adversarial network loss. In some examples, generative adversarial network loss is described in further detail in Mathieu, et al., "Disentangling Factors of Variation in Deep Representations using Adversarial Training," 2018 Conference on Neural Information Processing Systems, which is incorporated by reference herein.

In some examples, the discriminator network for T(y, z) may be trained to approximate an optimal discriminator $D_z$. In some examples, the discriminator network may be trained to distinguish the prior distribution p(z) for latent variable z with the distribution p*(z) during training. The trained discriminator $D_z$ may then be used to get the training distribution p*(z) using Equation 3, where p(z) is known as a standard Gaussian distribution.

$$p^*(z) = \frac{p(z) - D_Z p(z)}{D_Z} \quad \text{Equation 3}$$

Figure 5:
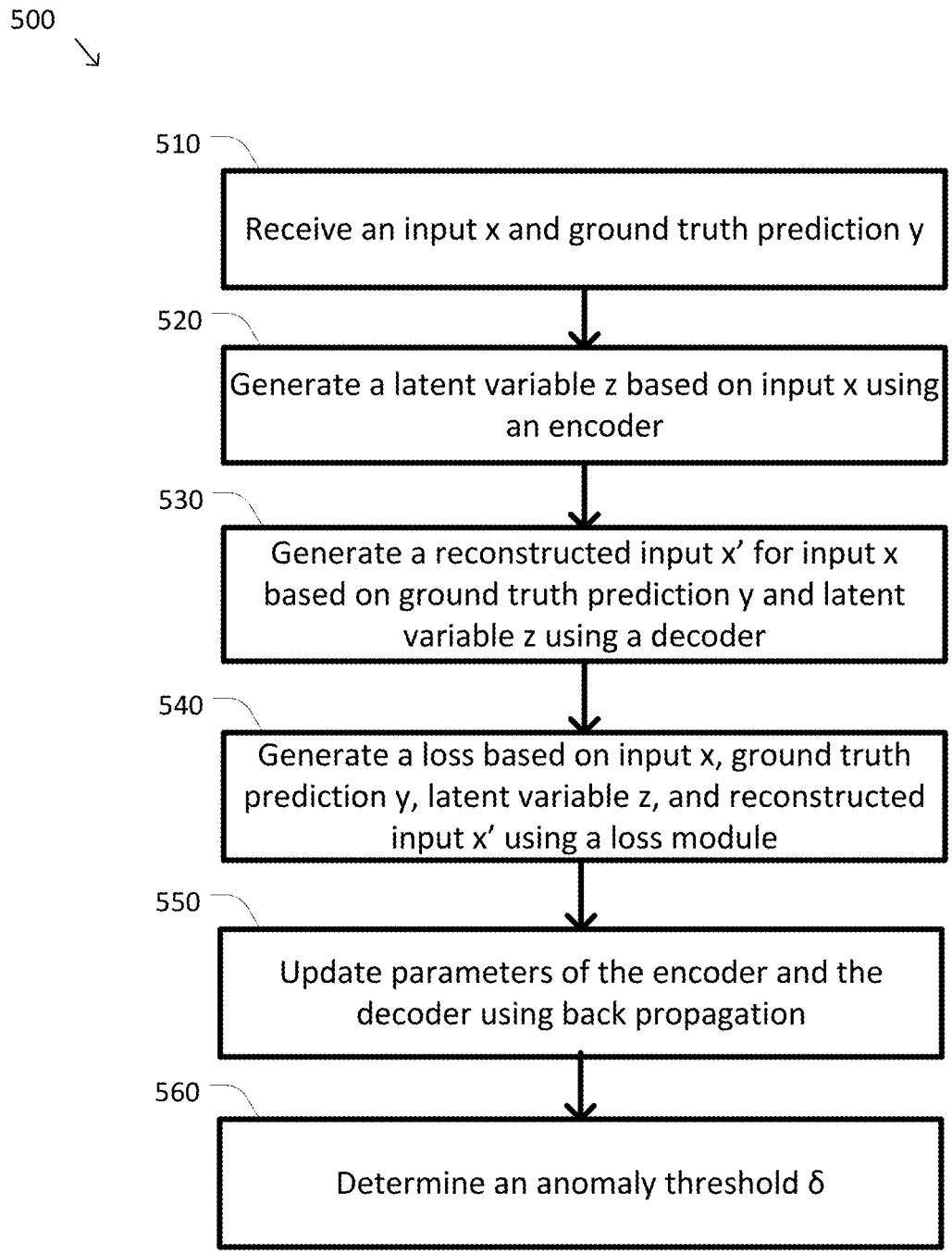
FIG. 5 is a simplified diagram of a method of training a verifier model according to some embodiments.

FIG. 5 is a simplified diagram of a method 500 of training a verifier model according to some embodiments. One or more of the processes 510-560 of method 500 may be implemented, at least in part, in the form of executable code stored on non-transitory, tangible, machine-readable media that when run by one or more processors may cause the one or more processors to perform one or more of the processes 510-560. In some embodiments, method 500 may correspond to the method used to train verifier module 130 and/or the structures of FIGS. 2 and/or 4.

At a process 510, an input x and a ground truth prediction y are received. In some examples, input x and ground truth prediction y may correspond to a training pair used to train a discriminative model, such as discriminative model 200. In some examples, input x may correspond to an image, natural language text, and/or the like. In some examples, ground truth prediction y may correspond to an image caption, a classification, and/or the like.

At a process 520, a latent variable z is generated based on input x using an encoder. In some examples, the encoder may be encoder 131. In some examples, process 520 may be substantially similar to process 330.

At a process 530, a reconstructed input x' for input x is generated based on ground truth prediction y and latent variable z using a decoder. In some examples, the decoder may be decoder 132. In some examples, process 530 may be substantially similar to process 340.

At a process 540, a loss is generated based on input x, ground truth prediction y, latent variable z, and reconstructed input x' by a loss module. In some examples, the loss module may be loss module 400. In some examples, the loss may be the evidence lower bound loss for the encoder and the decoder. In some examples, the loss includes a reconstruction loss, such as an $L^2$ loss between input x and reconstructed input x'. In some examples, the loss includes an estimate of the KL VAE loss for the encoder and latent variable z. In some examples, the loss includes a mutual information loss between ground truth prediction y and latent variable z. In some examples, the loss is determined according to Equation 2. In some examples, the loss is determined according to Equation 3.

At a process 550, parameters of the encoder and the decoder are updated using back propagation. In some examples, the loss may be used to estimate a gradient for the encoder and/or the decoder. In some examples, the back-propagation may be performed using any suitable training algorithm, such as stochastic gradient descent, ADAM, and/or the like.

At a process 560, an anomaly threshold δ is determined. In some examples, anomaly threshold δ may be a hyperparameter determined via search. In some examples, threshold δ is determined so as to obtain a desired true positive rate (e.g., 95 percent). In some examples, the threshold δ is determined via search during training so that the probability that an input x is correctly verified as within the input training distribution when the input x is within the input training distribution is at or above the desired true positive rate.

Method 500 may then be repeated for additional training samples for the discriminative network.

The effectiveness of the verifier modules of FIGS. 1, 2, and 4 are now described with respect to various image classification benchmarks and image captioning tasks. The analysis is based on the discriminative/classification models DenseNet and ResNet. DenseNet is described in further detail in Huang, et al., "Densely Connected Convolutional Networks," Proceedings of the 2017 IEEE Conference on Computer Vision and Pattern Recognition, and ResNet is described in further detail in He, et al., "Deep Residual Learning for Image Recognition," Proceedings of the 2016 IEEE Conference on Computer Vision and Pattern Recognition, both of which are incorporated by reference.

To evaluate the verifier modules, the following metrics are used as indicators of the effectiveness of the certainty scores in distinguishing in-distribution and out-of-distribution images. In-distribution images are positive samples, while out-of-distribution images are negative samples. True negative rate (TNR) or false positive rate (FPR) are set to obtain a 95 percent true positive rate (TPR). For example, letting TP, TN, FP, and FN denote true positive, true negative, false positive, and false negative, respectively, TNR=TN/(FP+TN) or FPR=FP/(FP+TN), when TPR=TP/(TP+FN) is 95 percent. The area under the receiver operating characteristic curve (AUROC) is determined from a receiver operating curve (ROC) plotting TPR against the false positive rate=FP/(FP+TN) by varying threshold δ. The AUROC is the probability that an in-distribution input x has a higher certainty score than an out-of-distribution input x. The area under the precision-recall curve (AUPR) is determined from a precision-recall (PR) curve plotting the precision=TP/(TP+FP) against recall=TP/(TP+FN) by varying the threshold. The verification accuracy is defined by $1-\min_\delta \{p_{in}(\mathcal{L} \leq \delta)p(x \in p_{in}) - p_{out}(\mathcal{L} > \delta)p(x \in p_{out})\}$, where $\mathcal{L}$ is the predicted certainty score, $p(x \in p_{in})$ and $p(x \in p_{out})$ are the probability of input x being considered in-distribution or out-of-distribution, respectively, for the test set. Verification accuracy corresponds to the maximum classification probability over all possible thresholds δ. AUROC, AUPR, and verification accuracy are evaluation metrics independent of threshold δ.

Various datasets are used for the evaluation. The Street View Housing Numbers (SVHN) dataset includes color images depicting house numbers, which range from 0 to 9. Images have a resolution of 32×32 pixels. The official training set split is used, which contains 73,257 images, and the test set split contains 26,032 images. The SVHN dataset is described in further detail in Netzer, et al, "Reading Digits in Natural Images with Unsupervised Feature Learning," 2011 Conference on Neural Information Processing, which is incorporated by reference. The CIFAR-10/100 datasets include 10/100 classes of color images. The CIFAR-10/100 training sets have 50,000 images, while the test sets have 10,000 images. The CIFAR-10/100 datasets are described in further detail in Krizhevsky, et al., "Learning Multiple Layers of Features from Tiny Images," 2012, available at https://www.researchgate.net/publication/265748773_Learning_Multiple_Layers_of_Features_from_Tiny_Images, which is incorporated by reference. The TinyImageNet dataset is a subset of the ImageNet dataset. The TinyImageNet test set includes 10,000 images from 200 different classes down-sampled to 32×32 pixels. The TinyImageNet dataset is described in further detail in Deng, et al, "Imagenet: A Large-scale Hierarchical Image Database," 2009 IEEE Conference on Computer Vision and Pattern Recognition, which is incorporated by reference. The Large-scale Scene UNderstanding (LSUN) dataset includes a test set with 10,000 images from 10 different classes. The LSUN (crop) and LSUN (resize) are created in a similar down sampling manner to the TinyImageNet datasets. The LSUN dataset is described in further detail in Yu, et al., "LSUN: Construction of a Large-scale Image Dataset using Deep Learning with Humans in the Loop," 2015, available at https://arxiv.org/abs/1506.03365, which is incorporated by reference. The Uniform Noise and Gaussian Noise datasets include 10,000 samples respectively, which are generated by drawing each pixel in a 32×32 RGB image from an independent and identically distributed uniform distribution of the range [0, 1] or an i.i.d Gaussian distribution with a mean of 0.5 and variance of 1. The Uniform Noise and Gaussian Noise datasets are described in further detail in Liang, et al., "Enhancing The Reliability of Out-of-distribution Image Detection in Neural Networks," 2018 International Conference on Learning Representations, which is incorporated by reference.

For fair comparisons, the backbones of each of the discriminative models/classifiers are the 100-layer DenseNet with growth rate 12 and 34-layer ResNet networks. Each are trained to classify the SVHN, CIFAR-10, CIFAR-100 and Tiny-ImageNet datasets, with the test set being regarded as the in-distribution dataset during testing. The datasets, which are different from the training dataset, is considered to be out-of-distribution. Four convolution and four deconvolution layers are used in the encoder and decoder structures respectively. Latent variable z is a 128-dimension vector. The discriminator network within loss module 400 is a two-layer fully connected layer network with sigmoid output and is trained using a binary cross-entropy loss. The hyper-parameters from the competing approaches are tuned on a validation set with 1,000 images from each in-distribution and out-of-distribution pair. Threshold δ of anomaly detection module 133 is tuned on in-distribution only training samples.

How the hyper-parameter (e.g., threshold δ) generalizes across different out-of-distribution datasets is a challenging aspect of the system deployment. In some examples, for most of the previous approaches target for the case where there is a small set of out-of-distribution samples, the threshold δ can be calibrated by evaluating the verification error at different values of threshold δ. However, it is more realistic that there is no access to out-of-distribution examples that can be sampled for use during the testing stage. Because the verifier networks of FIGS. 1, 2, and 4 do not need out-of-distribution samples, this is an improvement over prior approaches.

Figure 6A:
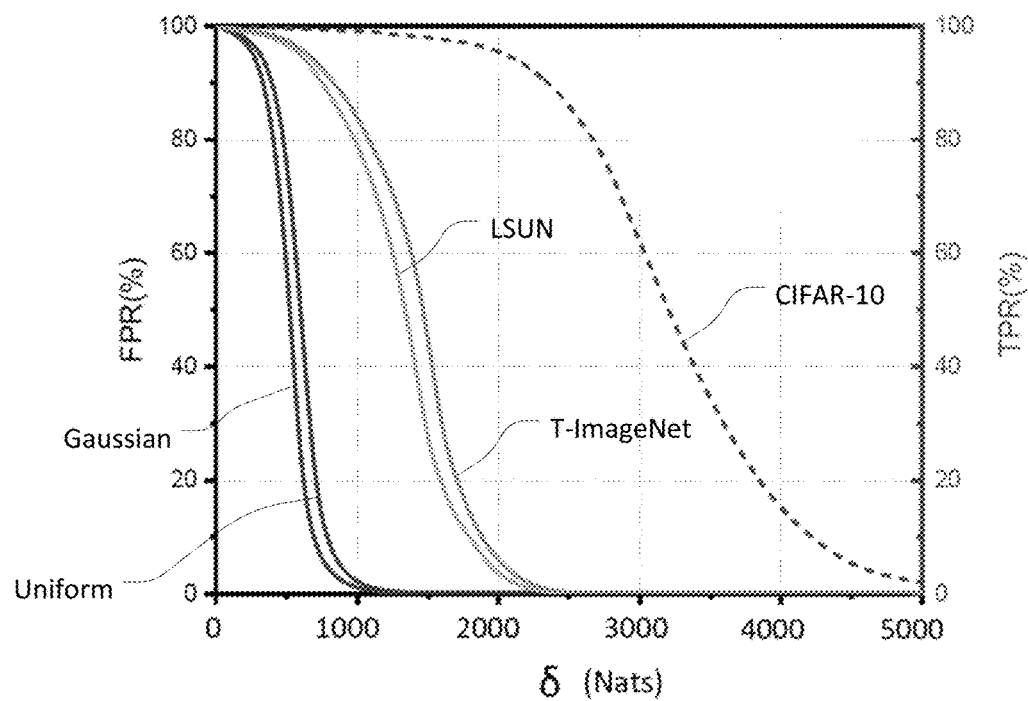
FIGS. 6A-6C are simplified diagrams of false and true positive rates for various datasets according to some embodiments.
Figure 6B:
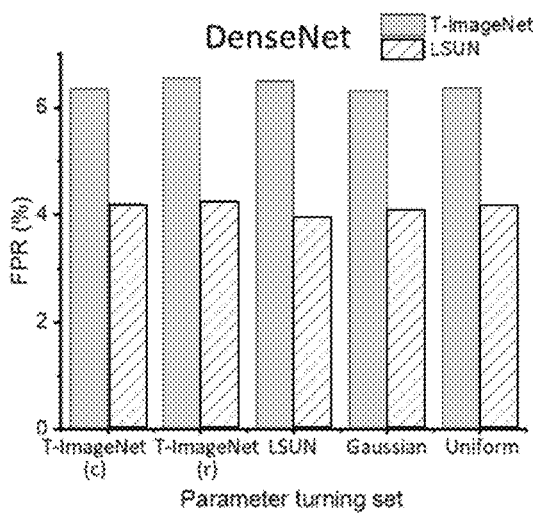
Figure 6C:
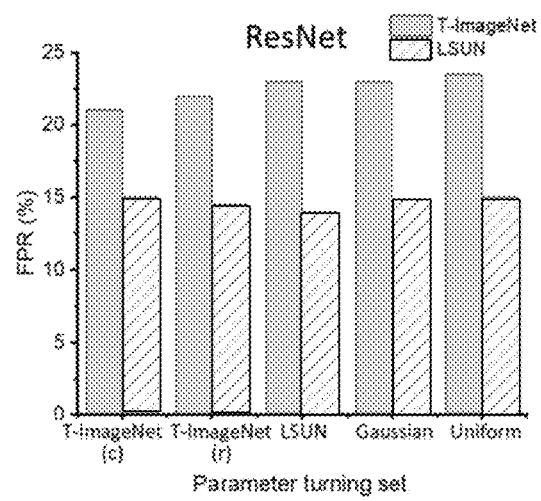

FIGS. 6A-6C are simplified diagrams of false and true positive rates for various datasets according to some embodiments. FIGS. 6A-6C show false positive rate (FPR) and true positive rate (TPR) under different values of threshold δ when using CIFAR-10 as the in-distribution dataset, and Tiny-ImageNet(resize), LSUN and Gaussian/Uniform noise as the out-of-distribution dataset. The results of FIGS. 6a-6b are shown for models based on the DenseNet architecture. FIGS. 6A-6C show how the value of threshold δ affects the FPR and TPR. As shown in FIGS. 6A-6C, the value of threshold δ corresponding to a 95 percent TPR is able to produce small FPRs for each of the out-of-distribution datasets. When the out-of-distribution images are sampled from some simple distributions (e.g., Gaussian Noise and/or Uniform Noise), the available window of threshold δ may be larger.

FIG. 7 is a simplified diagram of image classification results according to some embodiments. More specifically, FIG. 7 shows the results for various combinations of the in-distribution (In-Dist) and out-of-distribution (OOD) dataset pairs for both out-of-distribution and adversarial samples. For comparison, the results of the out-of-distribution image detection (ODIN) and the simple unified framework (SUF) are shown along with the results when using the verifier modules of FIGS. 1, 2, and 4 (Our) with the bolded entries representing the best results for the particular combination. As FIG. 7 shows, the verifier modules of FIGS. 1, 2, and 4 consistently outperform the ODIN and SUF and achieves a new state-of-the-art. ODIN is described in further detail in Liang, et al., "Enhancing The Reliability of Out-of-distribution Image Detection in Neural Networks," 2018 International Conference on Learning Representations, and SUF is described in further detail in Lee, et al., "A Simple Unified Framework for Detecting Out-of-Distribution Samples and Adversarial Attacks," 2018 Conference on Neural Information Processing Systems, both of which are incorporated by reference.

FIG. 8 is a simplified diagram of test error rate according to some embodiments. As shown in the examples of FIG. 8, the pre-processing and model change in ODIN and SUF can unavoidably increase the error rate of the original classification for in-distribution testing with both the CIFAR-10 and CIFAR-100 datasets, while the verifier modules of FIGS. 1, 2, and 4 do not affect the classification performance.

FIGS. 9A and 9B are simplified diagrams of comparative recall and false positive rates according to some embodiments. Because the technical approach used in the verifier modules of FIGS. 1, 2, and 4 is essentially different with that used by ODIN and SUF, FIGS. 9A and 9B compare the verifier modules of FIGS. 1, 2, and 4 with a baseline maximum softmax probability (MSP) approach with respect to ROC and PR. The verifier modules of FIGS. 1, 2, and 4 share some nice properties of MSP, e.g., fixed classifier and single forward pass at the test stage, however, the verifier modules of FIGS. 1, 2, and 4 outperform MSP by a large margin. MSP is described in further detail in Hendrycks, et al., "A Baseline for Detecting Misclassified and Out-of-Distribution Examples in Neural Networks," 2017 International Conference on Learning Representations, which is incorporated by reference.

FIG. 10 is a simplified diagram of the impact of disentanglement according to some embodiments. As FIG. 10 shows, using the disentanglement constraint to separate prediction y from latent variable z improves the performance of the verifier modules of FIGS. 1, 2, and 4. FIG. 10 shows the impact of disentanglement with respect to metrics that are both dependent and independent of threshold S. The verifier modules trained using a lost that includes the mutual information loss (e.g., from Equation 2) are able to outperform verifier modules trained without it (e.g., from Equation 1) for both the TNR and AUROC metrics.

FIG. 11 is a simplified diagram of an area under the receiver operating characteristic curve (AUROC) according to some embodiments. FIG. 11 shows a comparison between the verifier modules of FIGS. 1, 2, and 4 with the strategies of KD+PU, LID, and SUF. KD+PU are described in further detail in Feinman, et al., "Detecting Adversarial Samples from Artifacts," 2017, available at https://arxiv.org/abs/

1703.00410, and LID is described in further detail in Ma, et al., "Characterizing Adversarial Subspaces using Local Intrinsic Dimensionality," 2018, available at https://arxiv.org/abs/1801.02613, both of which are incorporated by reference. As FIG. 11 shows, the verifier modules of FIGS. 1, 2, and 4 are able to achieve state-of-the-art performance in most cases with respect to AUROC with the best results for the combination shown in bold. Following a "detection of unknown attack" approach, the verifier modules of FIGS. 1, 2, and 4 do not have access to the adversarial examples used during testing when they are being trained or validated.

To detect the adversarial samples, the DenseNet and ResNet-based discriminative/classification networks and the verifier modules of FIGS. 1, 2, and 4 are trained using the training sets of the CIFAR-10, CIFAR-100, or SVHN datasets, and their corresponding test sets are used as the positive samples for the test. Attacks of various types are used to generate the negative samples, including the basic iterative method (BIM), DeepFool, and Carlini-Wangner (CW). BIM is described in further detail in Kurakin, et al., "Adversarial Examples in the Physical World," 2016, available at https://arxiv.org/abs/1607.02533, DeepFool is described in further detail in Moosavi, et al., "DeepFool: A Simple and Accurate Method to Fool Deep Neural Networks," Proceedings of the 2016 IEEE Conference on Computer Vision and Pattern Recognition, and CW is described in further detail in Carlini, et al, "Adversarial Examples are not Easily Detected: Bypassing ten Detection Methods," Proceedings of the 10th ACM Workshop on Artificial Intelligence and Security, 2017, each of which is incorporated by reference. The negative adversarial samples used to train KD+PU, LID, and SUF are generated using the fast gradient sign method (FGSM). FGSM is described in further detail in Goodfellow, et al., "Explaining and Harnessing Adversarial Examples," 2014, available at https://arxiv.org/abs/1412.6572, which is incorporated by reference.

Unlike KD+PU, LID, and SUF, the verifier modules of FIGS. 1, 2, and 4 do not need another attack method to generate adversarial samples as a reference during training because threshold $\delta$ is determined from the validation set of in-distribution training samples. Moreover, the pre-processing and model change of SUF is not needed with the verifier modules of FIGS. 1, 2, and 4.

FIG. 12 is a simplified diagram of image captioning results according to some embodiments. The results of FIG. 12 are based on the Oxford-102 and CUB-200 in-distribution datasets. The Oxford-102 dataset include 8,189 images of 102 classes of flower. The CUB-200 dataset includes 11,788 images of 200 bird species. Each of images in the Oxford-102 and CUB-200 datasets has 10 descriptions. For both the Oxford-102 and CUB-200 datasets, 80 percent of the samples are used to train the discriminative model/captioner and the remaining 20 percent are used for cross-validation testing. Images from the LSUN and Microsoft COCO datasets are used for out-of-distribution testing samples. The Microsoft COCO dataset is described in further detail in Lin, et al., "Microsoft COCO: Common Objects in Context," 2014, available at https://arxiv.org/abs/1405.0312, which is incorporated by reference.

The discriminative model/captioner is described in further detail in Xu, et al., "Show, Attend and Tell: Neural Image Caption Generation with Visual Attention," 2015, available at https://arxiv.org/abs/1502.03044, which is incorporated by reference. The generator of GAN-INT-CLS is used as the architecture for decoder 132 with the normal distribution vector replaced as the output for latent variable z. A character level CNN-RNN model is used for the text embedding which produces the 1,024-dimension vector from the description, and then projects it to a 128-dimension code c. The encoder and the decoder each include four convolutional layers and the latent vector z is a 100-dimension vector. The input of discriminator in loss module 400 is a concatenation of latent variable z and c, which result in a 228-dimension vector. The discriminator further includes a two-layer fully connected network with sigmoid output unit. The Oxford-102 and CUB-200 datasets the GAN-INT-CLS architecture, and the CNN-RNN model are described in greater detail in Reed, et al., "Learning Deep Representations of Fine-grained Visual Descriptions," Proceedings of the 2016 IEEE Conference on Computer Vision and Pattern Recognition, which is incorporated by reference.

Some examples of computing devices, such as computing device 100 may include non-transitory, tangible, machine readable media that include executable code that when run by one or more processors (e.g., processor 110) may cause the one or more processors to perform the processes of methods 300 and/or 500. Some common forms of machine readable media that may include the processes of methods 300 and/or 500 are, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which a processor or computer is adapted to read.

This description and the accompanying drawings that illustrate inventive aspects, embodiments, implementations, or applications should not be taken as limiting. Various mechanical, compositional, structural, electrical, and operational changes may be made without departing from the spirit and scope of this description and the claims. In some instances, well-known circuits, structures, or techniques have not been shown or described in detail in order not to obscure the embodiments of this disclosure. Like numbers in two or more figures represent the same or similar elements.

In this description, specific details are set forth describing some embodiments consistent with the present disclosure. Numerous specific details are set forth in order to provide a thorough understanding of the embodiments. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. A method of verifying a prediction of a discriminative model, the method comprising:
   receiving an input;
   receiving a prediction from the discriminative model for the input;
   encoding, using an encoder of a generative model, a latent variable based on the input;
   decoding, using a decoder of the generative model, a reconstructed input based on the prediction and the latent variable; and
   determining, using an anomaly detection module, whether the prediction is reliable based on the input, the reconstructed input, and the latent variable;
   wherein the encoder and the decoder are jointly trained to maximize an evidence lower bound of the generative model; and
   the threshold is selected to establish a desired true positive rate or inputs that are within a distribution of inputs used to train the discriminative model.

2. The method of claim 1, wherein the encoder and the decoder are convolutional neural networks.

3. The method of claim 1, wherein determining whether the prediction is reliable comprises:
   determining an anomaly measure based on the input, the reconstructed input, and the latent variable; and
   determining that prediction is reliable when the anomaly measure is at or above a threshold.

4. The method of claim 3, wherein determining the anomaly measure comprises:
   determining a reconstruction loss between the input and the reconstructed input; and
   determining a variational autoencoder loss for the latent variable and the encoder.

5. The method of claim 1, wherein the discriminative model is an image classifier, an image captioner, or a text classifier.

6. The method of claim 1, wherein the encoder and the decoder are further trained using a disentanglement constraint between the prediction of the discriminative model and the latent variable.

7. The method of claim 6, wherein the disentanglement constraint reduces mutual information between the prediction of the discriminative model and the latent variable between the prediction of the discriminative model and the latent variable.

8. The method of claim 1, wherein the encoder and the decoder are further trained without using inputs that are out of a distribution of inputs used to train the discriminative model and without using inputs that are adversarial to the discriminative model.

9. A non-transitory machine-readable medium comprising executable code which when executed by one or more processors associated with a computing device are adapted to cause the one or more processors to perform a method comprising:
   receiving an input;
   receiving a prediction from a discriminative model for the input;
   encoding, using an encoder of a generative model, a latent variable based on the input;
   decoding, using a decoder of the generative model, a reconstructed input based on the prediction and the latent variable; and
   determining, using an anomaly detection module, whether the prediction is reliable based on the input, the reconstructed input, and the latent variable;
   wherein the encoder and the decoder are jointly trained to maximize an evidence lower bound of the generative model; and
   the threshold is selected to establish a desired true positive rate or inputs that are within a distribution of inputs used to train the discriminative model.

10. The non-transitory machine-readable medium of claim 9, wherein the encoder and the decoder are convolutional neural networks.

11. The non-transitory machine-readable medium of claim 9, wherein determining whether the prediction is reliable comprises:
    determining an anomaly measure based on the input, the reconstructed input, and the latent variable; and
    determining that prediction is reliable when the anomaly measure is at or above a threshold.

12. The non-transitory machine-readable medium of claim 11, wherein determining the anomaly measure comprises:
    determining a reconstruction loss between the input and the reconstructed input; and
    determining a variational autoencoder loss for the latent variable and the encoder.

13. The non-transitory machine-readable medium of claim 9, wherein the discriminative model is an image classifier, an image captioner, or a text classifier.

14. The non-transitory machine-readable medium of claim 9, wherein the encoder and the decoder are further trained using a disentanglement constraint between the prediction of the discriminative model and the latent variable.

15. The non-transitory machine-readable medium of claim 14, wherein the disentanglement constraint reduces mutual information between the prediction of the discriminative model and the latent variable between the prediction of the discriminative model and the latent variable.

16. The non-transitory machine-readable medium of claim 9, wherein the encoder and the decoder are further trained without using inputs that are out of a distribution of inputs used to train the discriminative model and without using inputs that are adversarial to the discriminative model.

17. A verifier module for verifying predictions from a discriminative model, the verifier module comprising:
    an encoder for receiving an input and generating a latent variable;
    a decoder for receiving a prediction from the discriminative model and generating a reconstructed input from the prediction and the latent variable; and
    an anomaly detection module for determining whether the prediction is reliable by determining an anomaly measure based on the input, the reconstructed input, and the latent variable;
    wherein the encoder and the decoder are jointly trained to maximize an evidence lower bound in generating the reconstructed input; and
    wherein the anomaly detection module determines the anomaly measure by determining a reconstruction loss between the input and the reconstructed input, and determining a variational autoencoder loss for the latent variable and the encoder.

18. The verifier module of claim 17, wherein the encoder and the decoder are convolutional neural networks.

19. The verifier module of claim 17, wherein the anomaly detection module determines whether the prediction is reliable further by:
    determining that prediction is reliable when the anomaly measure is at or above a threshold.

20. The verifier module of claim 17, wherein the discriminative model is an image classifier, an image captioner, or a text classifier.

\* \* \* \* \*